US009018320B2

(12) United States Patent
Krüger et al.

(10) Patent No.: US 9,018,320 B2
(45) Date of Patent: Apr. 28, 2015

(54) DIELECTRIC POLYMERS WITH ELEVATED PERMITTIVITY, PROCESS FOR PREPARATION THEREOF AND END USES THEREOF

(75) Inventors: Hartmut Krüger, Berlin (DE); Björn Kussmaul, Berlin-Spandau (DE); Guggi Kofod, Kopenhagen (DK); Sebastian Risse, Potsdam (DE)

(73) Assignee: Fraunhofer-Gesellschaft zur Förderung der Angewandten Forschung e.V., München (DE)

( * ) Notice: Subject to any disclaimer, the term of this patent is extended or adjusted under 35 U.S.C. 154(b) by 0 days.

(21) Appl. No.: 13/823,053

(22) PCT Filed: Sep. 23, 2011

(86) PCT No.: PCT/EP2011/004782
§ 371 (c)(1),
(2), (4) Date: Jun. 3, 2013

(87) PCT Pub. No.: WO2012/038093
PCT Pub. Date: Mar. 29, 2012

(65) Prior Publication Data
US 2013/0253146 A1 Sep. 26, 2013

(30) Foreign Application Priority Data
Sep. 23, 2010 (DE) .......................... 10 2010 046 343

(51) Int. Cl.
| C08G 77/04 | (2006.01) |
| C08G 77/06 | (2006.01) |
| C08G 77/388 | (2006.01) |
| C08G 77/38 | (2006.01) |
| C08L 83/10 | (2006.01) |
| H01L 41/193 | (2006.01) |
| C08G 77/12 | (2006.01) |
| C08G 77/20 | (2006.01) |

(52) U.S. Cl.
CPC .............. *C08G 77/04* (2013.01); *C08G 77/12* (2013.01); *C08G 77/20* (2013.01); *C08G 77/38* (2013.01); *C08L 83/10* (2013.01); *C08G 77/06* (2013.01); *C08G 77/388* (2013.01); *H01L 41/193* (2013.01)

(58) Field of Classification Search
CPC ...... C08G 77/83; C08G 77/388; C08G 77/04; C08G 77/06; C08G 77/12; C08G 77/20; C08L 83/10; C08L 83/00
USPC .................... 525/479, 478; 528/28
See application file for complete search history.

(56) References Cited

U.S. PATENT DOCUMENTS

| 4,971,426 A | 11/1990 | Schildkraut et al. |
| 4,999,139 A * | 3/1991 | Kurihara et al. ............ 252/587 |
| 5,103,060 A | 4/1992 | Brox et al. |
| 5,298,588 A | 3/1994 | Gibbons et al. |
| 5,663,308 A * | 9/1997 | Gibbons et al. ............ 534/573 |
| 5,977,685 A | 11/1999 | Kurita et al. |
| 6,545,384 B1 | 4/2003 | Pelrine et al. |
| 6,689,288 B2 | 2/2004 | St. Clair et al. |
| 7,224,106 B2 | 5/2007 | Pei et al. |
| 7,719,164 B2 * | 5/2010 | Gologanu et al. ........... 310/309 |
| 2003/0052576 A1 | 3/2003 | St. Clair et al. |
| 2004/0127986 A1* | 7/2004 | Chen et al. .................. 623/11.11 |
| 2005/0018096 A1* | 1/2005 | Chono et al. .................... 349/33 |
| 2008/0023871 A1* | 1/2008 | Okonski et al. ............... 264/148 |
| 2010/0313983 A1* | 12/2010 | Aoki et al. .................... 137/831 |

FOREIGN PATENT DOCUMENTS

| DE | 690 26 456 T2 | 11/1996 |
| EP | 0 415 278 A1 | 3/1991 |

OTHER PUBLICATIONS

Finkelmann et al., "Investigations on Liquid Crystalline Polysiloxanes 3. Liquid Crystalline Elastomers—A New Type of Liquid Crystalline Material," *Die Makromolekulare Chemie*, vol. 2, No. 4, pp. 317-322 (1981).
Mc Carthy et al., "The effect of dispersion on the increased relative permittivity of $TiO_2$/SEBS composites," *J. Phys. D: Appl. Phys.*, vol. 42, p. 154406 (2009).
Meng et al., "Synthesis and characterization of side-chain liquid-crystalline polysiloxanes containing fluorinated units," *Colloid and Polymer Science*, vol. 286, No. 8-9, pp. 873-879 (2008).
Portugall et al., "Synthesis and Phase Behaviour of Liquid Crystalline Polyacrylates," *Die Makromolekulare Chemie*, vol. 183, No. 10, pp. 2311-2321 (1982).
European Patent Office, International Search Report in International Application No. PCT/EP2011/004782 (Dec. 15, 2011).
European Patent Office, International Preliminary Report on Patentability in International Application No. PCT/EP2011/004782 (Apr. 4, 2013, 2011).
Frübing et al., "Relaxation behavior of thermoplastic polyurethanes with covalently attached nitroaniline dipoles," *Polymer* 43, pp. 2787-2794 (2002).
German Patent Office, Office Action in German Application No. 10 2010 046 343.7 (Jun. 7, 2011).

* cited by examiner

*Primary Examiner* — Mike M Dollinger
(74) *Attorney, Agent, or Firm* — Leydig, Voit & Mayer, Ltd.

(57) ABSTRACT

The present invention relates to a polymer which has an electronic dipole covalently bonded to the polymer structure. The polymer structure forming the basis of the polymer is in particular an elastomer which can be unbranched, or also branched or crosslinked. The present invention equally describes a method for bonding a dipole molecule to a corresponding polymer structure or elastomer structure. The polymer in accordance with the invention can be present as a pure substance or also as a mixture with any other polymers, preferably with further elastomers. Uses of the polymer or of the obtained polymer blend will equally be provided.

10 Claims, No Drawings

DIELECTRIC POLYMERS WITH ELEVATED PERMITTIVITY, PROCESS FOR PREPARATION THEREOF AND END USES THEREOF

CROSS-REFERENCE TO RELATED APPLICATIONS

This patent application is the U.S. national phase of International Application No. PCT/EP2011/004782, filed on Sep. 23, 2011, which claims the benefit of German Patent Application No. DE 10 2010 046 343.4, filed Sep. 23, 2010, the disclosures of which are incorporated by reference.

The present invention relates to a polymer which has an electronic dipole covalently bonded to the polymer structure. The polymer structure forming the basis of the polymer is in particular an elastomer which can be unbranched, or also branched or crosslinked. The present invention equally describes a method for bonding a dipole molecule to a corresponding polymer structure or elastomer structure. The polymer in accordance with the invention can be present as a pure substance or also as a mixture with any other polymers, preferably with further elastomers. Uses of the polymer or of the obtained polymer blend will equally be provided.

There is a need for electrically controllable "artificial muscles" in robotics, orthopedics and other fields. The development of intelligent designs such as minimum energy actuators or stack actuators with very small layer thicknesses is required to obtain the best possible performance characteristics. There is a great interest in electroactive polymer actuators which can convert electrical energy into linear mechanical movement. Although actuators have already been developed which can carry out deflections of more than 100%, reliable and repeatable relative elongations of 10 to 20% are, however, the current state of the art. These relative elongations also require an operating voltage of several thousand volts.

Due to these high operating voltages, which are impractical and unreliable, scientists are researching materials which can also be operated at lower voltages. The activity of an actuator can be improved in that its capability of storing the electrical energy density is improved. This corresponds to the increase of the permittivity $\in_r$ of the active material. Many approaches have resulted in a deterioration of the mechanical properties and reduced breakdown field strengths above which the material suffers a catastrophic electrical breakdown.

Dielectric elastomers are suitable as base materials for artificial muscles and actuator engineering applications. Mainly polyurethane (PU) elastomers and polydimethyl siloxane (PDMS) elastomers are discussed as possible material classes. The mechanical properties of the named polymers can easily be adapted to the requirements of artificial muscles and actuator engineering elements due to the plurality of base structures suitable for PU and PDMS synthesis. The permittivity of the named polymer structures is, however, as a rule limited to values of up to 3. Switching voltages of as a rule >1 kV thereby result for artificial muscles and actuator engineering elements produced from these materials. These high switching voltages set tight limits on the application of this technology. Different technical proposals and solutions have therefore been put forward which result in a considerable rise in permittivity. The permittivity of the elastomers can thus be considerably increased by blending the named polymers with nanoparticles of highly permittive inorganic materials such as barium titanate, lead zirconate, titanium dioxide among others so that lower switching voltages of some hundred volts can be achieved. These solutions, however, include considerable disadvantages which are found in a substantial deterioration of the processing properties, in a change in the mechanical properties of the elastomers (stiffening) and in problems in the homogeneous distribution of the nanoparticles in the elastomer matrix. Nanoparticles can aggregate, agglomerate and result in problems in the formation of homogeneous elastomer films. Furthermore, nanoparticles of the named inorganic materials are as a rule highly reactive due to their high inner surface and can thus result in a destructuring or in damage to the elastomer matrix. Furthermore, the interactions at the nanoparticle/elastomer matrix interface represent a frequent problem which is not easy to solve in the use of nanoparticles for increasing the permittivity of dielectric elastomers.

Actuators which comprise soft dielectric elastomers deform due to the Maxwell pressure $\sigma_{Maxwell}$ which is induced by the electric field and interacts with the mechanical properties of the material.

$$s_z = \frac{\sigma_{Maxwell}}{E} = \frac{\in_0 \in_r E_b^2}{E} = \frac{\in_0 \in_r \left(\frac{U_b}{d}\right)^2}{E}$$

Here, $s_z$ is the maximum deformation in the z direction, $\sigma_{Maxwell}$ the electrostatic pressure of the electrodes, E elastic modulus of the material, $\in_0$ the permittivity of the vacuum, $\in_r$ the relative permittivity of the material, $E_b$ the breakdown field strength, $U_b$ the breakdown voltage and d the thickness of the active material. It can be seen from the above equation that the relative permittivity has to be increased and the elastic modulus has to be decreased to achieve large elongations and low voltages. The thickness of the electrical film can likewise be reduced, but is limited by the technical possibilities. The currently lowest layer thickness which has been realized for the purposes of actuator engineering is at approximately 5 µm.

Scientists have to date been attempting to modify existing elastomers by the addition of further components such as filling particles. Electronically non-conductive and conductive particles are used for this purpose. The advantage of the simplicity of the modification of already existing elastomers has led to many different approaches in material research.

$TiO_2$, $BaTiO_3$, PMN-PT (lead magnesium niobate with lead titanate) or other materials can be used as ceramic dielectric particles. These ceramic materials are known for their high permittivities which are typically several orders of magnitude higher than the permittivity of the amorphous elastomer. The direct dispersion of the particles has produced unclear results. On the one hand improvements and on the other hand deteriorations were achieved in the maximum actuator deflection. This is due to the relatively small increase in the permittivity of the composite and the simultaneous great increase in the elastic modulus by the particle addition. A further possibility of lowering the elastic modulus is the addition of plasticizers. The use of surfactants results in an improved dispersion of the particles and prevents their agglomeration. Particles with a diameter of only 15 nm can thus also be used. The poor quality of most composites, however, had the result that possible uses of these materials as actuators were not pursued further. The sensitivity ($\in_0 \in_r/E$) of the composite actuators has only been improved by 50% by the modification of the surface of the nanoparticles with silanes.

Electrically conductive particles have likewise been used; in first trials, dyes and conductive polymers were used. A later publication gave rise to doubts with respect to the increase in permittivity. The increase in permittivity in CuPc PU composites, for example, was the consequence of an incomplete chemical reaction. A paper which is based on the random distribution of electrically conductive carbon black particles in a thermoplastic elastomer resulted in a great increase in permittivity, but also simultaneously in a greatly reduced breakdown field strength. In another paper, a semiconductive polymer (poly(3-hexylthiophene)) was mixed with a chemically linking silicone. An increase in permittivity as well as a reduction in the elastic modulus resulted from this. In all previously mentioned cases, the breakdown field strength was also always greatly reduced in addition to the improvements achieved. This very greatly limits the maximum actuator deflection. In a publication which appeared recently, it was shown that the joining of a conductive polymer to the main chain of the elastomer only has very little influence on the breakdown field strength. This approach moreover results in a great increase in the actuator properties, with the dielectric losses, however, also being increased to a small degree.

Dielectric elastomer actuators (DEAs) are electroactive polymers which can deform a lot due to the application of an activation voltage. They are therefore also often called "artificial muscles". These components (U.S. Pat. Nos. 5,977,685, 7,719,164 B2, 6,545,384 B1, 6,689,288 B2, 7,224,106 B2) in the simplest case comprise an elastic dielectric with the thickness d which is located between two stretchable electrodes. This technology has a number of practical advantages over conventional actuators:

high specific electromagnetic energy;

deformation-based movement and thereby continuous, jerk-free deflection;

noiseless;

high efficiency due to the direct coupling to the voltage signal; and soft materials and thereby low sensitivity to jolts.

These dielectric converters can likewise be used in sensor engineering and in so-called energy harvesting due to their principle of functionality. Both fields of application have great potential. There are in particular many different applications which are ready for the market in sensor engineering.

The current disadvantages of these actuator systems are the high operating voltages of several thousand volts. For this reason, materials with a high permittivity $\in_r$, high breakdown field strength $E_b$ and low elastic modulus E are being looked for to increase the maximum elongation $s_z$ and to lower the operating voltage U.

Starting from this, it is therefore the object of the invention to set forth a polymer material suitable for a dielectric and having a high permittivity, a high breakdown field strength and a low elastic modulus which can be operated at lower voltages. It is equally the object of the present invention to set forth a corresponding manufacturing method for such materials.

This object is achieved by the features of the polymer material and the method of manufacturing the polymer material described herein, and the advantageous developments thereof. Uses according to the invention are also described.

In accordance with the invention, a polymer is thus provided which has a dipole covalently bonded to the polymer structure underlying the polymer in accordance with the general formula

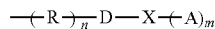

Formula 1 where

A is an electron acceptor functionality selected from the group comprising —$NO_2$, —CN, —F, —$CF_3$; cyanovinyl-, dicyanovinyl- or tricyanovinyl-residues;

X is an organic residue with a delocalized electron system which allows a delocalization, e.g. via an IT electron system, of the electrons between D and A;

D is an electron donor functionality selected from the group comprising —O— or —N(B)—, where B is hydrogen or a linear or branched alkyl residue with 1 to 16 carbon atoms;

R represents an alkylene residue with 1 to 16 carbon atoms, preferably 2 to 8 carbon atoms, in particular 2 or 3 carbon atoms; and n=0 or 1 and m=1, 2, 3 or 4.

The bonding of the dipole to the polymer structure in this respect takes place via the residue R (for the case that n=1) or via the donor D (for the case that n=0).

It has surprisingly been found that the polymers in accordance with the invention have a much increased permittivity in comparison with dielectric elastomers known from the prior art. The permittivity can in this respect be determined, for example, at 0.1 Hz or also at 1 Hz. The measurement process for determining the permittivity in this respect takes place according to D. N. McCarthy, S. Risse, and P. Katekomol and G. Kofod, The effect of dispersion on the increased relative permittivity of TiO2/SEBS composites, J. Phys. D: Appl. Phys. 42, p. 145406, 2009. doi: 10.1088/0022-3727/42/14/145406. The determination of the permittivity in this respect takes place according to the following typical measurement processes. First the polymer film is applied to a glass substrate using a sputtered gold electrode (dia. 10 mm) in the drop casting process. After the film application, the film thickness is determined using a micrometer screw by difference measurement. An electrode of gold powder is subsequently applied with the help of a mask. This improves the electrical contact between the film and the solid metal electrode which is subsequently applied to the film. The dielectric parameters of conductivity ($\sigma$), permittivity ($\in_r$), dielectric loss ($\in''$) and dielectric loss factor ($\tan(\delta)$) are measured at a frequency interval of 0.1 Hz to 10 MHz. It has in particular been found that the permittivity in this respect amounts to at least 4.0, preferably to at least 5.0, particularly preferably at least 6.0. Even higher values can be reached.

In accordance with the invention, the objective can thus e.g. be reached by highly permittive elastomers, in particular based on PU and PDMS, by the covalent bonding of so-called organic dipole molecules. In accordance with the invention, those organic dipoles can preferably be considered as suitable organic dipoles in accordance with the invention having aromatic or heteroaromatic base structures which are substituted at a suitable point by suitable donor groups and acceptor groups.

In this respect, the dipole molecules can, for example, be terminally bonded to the polymer structure; alternatively or additionally hereto, however, a bonding of the dipole molecules in a non-terminal portion of the polymer structure is equally also possible.

A preferred embodiment provides that the dipole is represented by the general formula II:

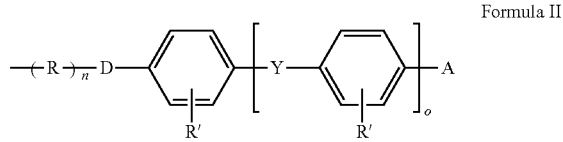

Formula II where

A, D R and n have the above-indicated meaning and

R' is respectively independently selected from the group comprising hydrogen, linear or branched alkyl residues with 1 to 18 carbon atoms as well as aromatic residues;

Y is a chemical bond represented or selected from the group comprising cis- or trans-1,2-ethenediyl, ethinediyl residues, a diazo group or a 1,2-azomethine dyil group; and o=0 to 10, preferably 1, 2 or 3.

Preferred contents of the dipole, with respect to the polymer, are in this respect between 0.1 and 50% by weight, preferably between 1 and 20% by weight, particularly preferably between 5 and 10% by weight.

It is in particular preferred if an elastomer forms the basis for the polymer structure. This elastomer is in this respect advantageously selected from the group comprising linear or crosslinked polysiloxane, with the dipole being covalently bonded to a silicon atom; polyurethanes; polybutadiene rubbers and/or poly(meth)acrylates. In the previously named possibility where the dipole molecule is bonded to a polyurethane, a covalent bond is, for example, present between an isocyanate or hydroxyl functionality terminating the polyurethane; for this purpose the dipole molecule has specific functionalities which can react to these reactive functionalities of the polyurethane. In the possibility of bonding the dipole molecule to polybutadiene rubbers or poly(meth)acrylates, it is suitable to equip the dipole molecule, for example, with vinyl functionalities which can react with respect to the vinyl functionalities in the respective rubbers or acrylates. For the case that, for example, poly(meth)acrylic acids or poly(meth) acrylic esters are used, a bonding of the organic dipole molecules can also be effected with the aid of functional groups which can react with the corresponding functionalities (acid functionalities or acidic ester functionalities) under condensation or alcoholysis. It is, however, particularly advantageous if the polymer structure is based on a polysiloxane.

It is preferred for this case if the polysiloxane has 3 to 1000 silicon atoms, preferably 3 to 100 silicon atoms, in particular 3 to 40 silicon atoms 15. As can be seen from the above definition, a siloxane which only has three Si atoms, i.e. the structure derived e.g. from octamethyl trisiloxane, is equally already called a polysiloxane.

Preferred polysiloxanes are in this respect selected from the group comprising polydialkyl siloxanes as well as polyalkyl siloxanes which are partly hydrogen functionalized, with the ratio of the hydrogen functionalizations to the totality of hydrogen functionalizations and alkyl residues preferably amounting to between 0.01 and 1.5, further preferably between 0.1 and 1. The previously indicated definition for the water functionalization of the partly hydrogen functionalized polysiloxanes in this respect corresponds to the ratio of the hydrogen atoms bonded to the Si atoms in siloxane to the totality of the bonding points present for alkyl residues or hydrogen residues, in other words, to the totality of the bonds of the Si atoms, with the exception of the bonds to the oxygen atoms. By definition, the previously named "polydialkyl siloxanes", which are functionalized by a dipole in the sense of the invention, thus have one or more dipole molecules covalently bonded to silicon atoms. All further bonds of the silicon atoms which do not represent bonds to oxygen atoms are bonds to alkyl groups. The same definition also applies to the "partially hydrogen functionalized "polyalkyl siloxanes", with the proviso already indicted above that some of the alkyl residues have been replaced by hydrogen atoms.

In accordance with the invention, a blend is equally provided which contains at least one type of a polymer in accordance with the invention described above. The blend in this respect contains at least one type of any further polymer not functionalized with a donor. It is preferred in this respect that the at least one further polymer is selected from the group comprising elastomers, in particular linear or cross-linked polyalkyl siloxanes, linear or crosslinked partially hydrogen functionalized polysiloxanes, polyurethanes, polybutadiene rubbers and/or poly(meth)acrylates.

In accordance with the invention, a method of manufacturing a dipole substituted polymer in accordance with the invention described above is equally provided in which a reactive dipole molecule of the general formula III

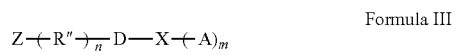

Formula III where D, X, A, n and m have the meaning set forth above; and

R" represents an alkylene residue with 1 to 16 carbon atoms, and

Z represents a reactive functionality, a) is brought to reaction with a polymer reactive with the reactive functionality Z while forming a covalent bond; or b) is brought to reaction with one type or a plurality of types of monomers and/or prepolymers, of which at least one type of monomer and/or prepolymer can react with the reactive functionality Z while forming a covalent bond, with the polymer structure simultaneously being formed.

The method in accordance with the invention thus includes two variants, according to which, in accordance with the variant a) shown, the reactive dipole molecule is brought to reaction with an already polymerized polymer. In this method variant, the reactive polymer is "doped" with the reactive dipole molecule in that the dipole molecule is bonded to the polymer structure. Such reactive polymers are also called crosslinking agents.

In accordance with the method variant b), the reactive dipole molecule is added to a mixture of a plurality of reactive types of monomers, prepolymers, etc., after which this mixture is subsequently polymerized, i.e. the polymer in accordance with the invention is first formed. A bonding of the dipole molecule to the polymer structure also takes place here. The prepolymers can also be called crosslinking agents.

In this respect, the reactive functionality Z is coordinated with the polymer type used and functional relative groups contained therein. Z is in particular selected from the group comprising hydrogen, groups of vinyl, allyl, —OH, —SH, —NH$_2$, —COOH or —CNO.

In a particularly preferred embodiment of the method, the reactive polymer, the monomer and/or the prepolymer has a functional group which reacts with the reactive functionality Z and which is selected from the group comprising —O—Si(H)$_p$(R''')$_{3-p}$, where R''' is selected from the group comprising linear or branched alkyl residues with 1 to 18 carbon atoms and where p is 1, 2 or 3;

—O—Si(H)$_q$(R''')$_{2-q}$, where R''' has the meaning set forth above and q is 1 or 2;

—N(H)$_q$(R''')$_{2-q}$, wherein R''' and q have the meanings set forth above; and —OH, —CNO, —COOH or —COOX, where X=Cl, Br, R''', and reactive double bonds.

This previously named embodiment applies to both of the method variants named further above under a) and b). The first of the previously named variants in this respect represents a terminal silane grouping which has at least one hydrogen atom. The second variant in this respect relates to a silane functionality bonded into the polymer chain and having at least one hydrogen atom. A bonding of the dipole molecule is possible using these silane functionalities, for example via the reaction mechanism of a hydrosilylation. In this case, the reactive functionality can, for example, be selected from functionalities which have a double bond; in particular vinyl groups or allyl groups can be considered here. A bonding via a reaction mechanism is equally conceivable in which e.g. a reactive —SiH functionality of a siloxane having a dipole molecule with a hydroxyl functionality using a catalyst and elimination of hydrogen is converted. In this case, a new Si—O bond is formed. The two groups of functionalities named in the following occur, for example, in polyurethanes or in polyacrylic acid derivatives. To be able to react with these functionalities, the reactive dipole molecules preferably have functionalities which are selected from acid functionalities, alcoholic functionalities or amino functionalities in order, for example, to be able to react with the previously named groups of the polymers or prepolymers and/or monomers by condensation.

Polymers or monomers or prepolymers which have reactive double bonds are present, for example, in polybutadiene rubbers. A bonding of the reactive dipole molecules to these functionalities is possible, for example, via radical reaction mechanisms. It is preferred in this respect if the reactive dipole molecules equally have double bonds such as vinyl functionalities or allyl functionalities.

In a further preferred variant, at least one further monomer, prepolymer and/or polymer is added to the reaction mixture and is non-reactive with respect to the reactive dipole molecule and reactive with respect to the reactive polymer, prepolymer and/or monomer. This variant further provides that a copolymer is formed in the method in accordance with the invention. The components further added to the reaction mixture in this respect only react with the first type of polymers or prepolymers or monomers, but not with the added dipole molecules.

In accordance with the previously described embodiment, it is preferred if the further monomer, prepolymer and/or polymer is selected from the group comprising vinyl-terminated siloxanes, vinyl-terminated alkyl siloxanes and/or vinyl-terminated dialkyl siloxanes.

A further preferred embodiment provides that the method takes place while adding a catalyst, preferably a platinum catalyst. In particular for the case that a hydrosilylation is carried out, platinum catalysts known from the prior art are preferred to achieve high conversions rates and yields.

It is furthermore preferred if the conversion of the reactive dipole molecule with the reactive polymers, monomers and/or prepolymers is carried out in a solvent, preferably in chloroform, pentane, hexane, cyclopentane, cyclohexane, dichloromethane and/or silicones.

To prepare a previously described blend of different polymers, in a further variant, at least one further unmodified polymer is blended in to the reaction mixture and/or to the obtained polymer during and/or subsequent to a previously described method.

In accordance with the invention, a molded body is equally provided which contains an initially described polymer or a blend thereof. In particular for the case that elastomer materials are used as the basis for the polymer or for the blend, this molded body can be configured in the form of an elastic film, of an electronic component, of a dielectric, of an artificial muscle and/or of an actuator, such as prestretched actuators and/or stacked actuators.

For example, the polymer film can be brought into a corresponding shape by a common shaping process from a solution of the polymer film (or of a blend thereof), in particular by coating with a doctor knife, by dip-coating, by printing or by casting. The hardening of the film takes place in this respect at elevated temperatures, for example between 50 and 180° C., in particular between 80 and 120° C.

In accordance with the invention, purposes of use of the polymer or of the polymer blend are equally set forth; the materials in accordance with the invention are in particular suitable as a dielectric, as an elastic dielectric, as an actuator, as an artificial muscle, as a dielectric for flexible electronic components, in particular capacitors, such as soft or flexible capacitors.

The present invention will be described in more detail with reference to the following embodiments and to examples without restricting the invention to the specific parameters shown there.

The above-described dipoles can be functionalized for the covalent bonding into the respective elastomer at the donor side or at the acceptor side, for example with vinyl groups or allyl groups (for introduction into e.g. PDMS) or with hydroxyl groups or amino groups (for introduction e.g. into (PU)) so that they are capable of a covalent integration into the respective elastomer network.

The bonding can be achieved in accordance with the invention, on the one hand, in that all the components including the organic dipoles are mixed, filmed and brought to reaction with one another in a one-shot process. Furthermore, the preparation of prepolymers from the organic dipoles and individual components of the PDMS or PU elastomers is possible whose products are then later converted to the final elastomer network. In this respect, the preparation of the prepolymers from the organic dipoles and individual components of the elastomers can take place in a manner such that their functionality is completely saturated and the then no longer reactive prepolymers are added to the elastomer formulation in any desired ratios as a highly compatible component. The prepolymer preparation can, however, also take place in a manner such that a residue functionality remains which then allows the covalent integration into the elastomer network.

The content of organic dipole can be varied within wide limits by the selection of the mixing ratio while observing the stoichiometry of the components. Dipole contents in the range from 0 to 20% by mass, preferably 1 to 10% by mass can therefore be realized which result in permittivities $\in_r$ of well above 5.

The manufacture of highly permittive elastomer films will be described in the following examples:

EXAMPLE 1

Synthesis of the Dipole Structure Dip-3

The dipole N-allyl-N-methyl-p-nitroaniline (Dip-3) used is prepared by direct allylation of the corresponding aniline with allyl alcohol.

For this purpose, 5.0 g (0.0329 mol) N-methyl-p-nitroaniline and a surplus of 5 ml allyl alcohol (0.0735 mol are dissolved in 200 ml absolute benzene which is above an 8 g molecular sieve MSA4. For the catalyzed reaction, 0.07 g (0.33 mmol) palladium-(II)-acetate, 2.5 ml (8.4 mmol) titanium-(IV)-isopropyloxide and 0.34 g (1.31 mmol) triphenylphosphine is added. The mixture is heated while stirring at 75° C. for 12 hours with backflow in an argonate atmosphere. Subsequently, the solution is filtered and separated by column chromatography (silica gel) in ethyl acetate:n-hexane=1:4, which results in 5.94 g (94.0%) of a yellow oil as a product which crystallizes in the refrigerator. The melting point lies at $T_{melt}$=38 to 40° C.

EXAMPLE 2

Synthesis of the Dipole Structure Dip-4

The dipole N-allyl-N-methyl-4(4'-nitrophenylazo)-aniline is prepared in a two-stage reaction. For this purpose, the first component is first allyl-functionalized in order subsequently to be converted to the desired dipole via an azo coupling.

The allylation takes place in the same manner as described in the rule of Example 1. 10.35 g (0.966 mol) N-methylaniline is converted with palladium catalysis using an excess of allyl alcohol. The reaction mixture is prepared by column chromatography in the solvent n-hexane:ethyl acetate=4:1. 9.87 g (64.4%, 0.0671 mol) of an orange colored oil is obtained as the product.

In a second reaction step, the prepared product is dissolved in diluted hydrochloric acid. 9.83 g (0.0415 mol) of the diazonium salt 4-nitrobenzene-diazonium tetrafluoroborate is likewise presented in a second hydrochloric acid solution. The solutions are combined while cooling at T=–5° C., whereby a strong red coloration of the solution arises, whereupon a pH of 4 is set using sodium acetate. A voluminous precipitation is hereby precipitated which is filtered and washed several times with water. The solid is recrystallized in ethanol, whereby 11.0 g (90%, 0.0371 mol) of the product is precipitated as shining greenish needles. The melting point $T_{melt}$ lies at 119 to 121° C.

EXAMPLE 3

Synthesis of the Long-Chain Filler x301-3

To integrate the selected dipole structure into the network, the dipole 3 is bonded to a crosslinking agent via a hydrosilylation with platinum catalysis, said crosslinking agent comprising a long-chain PDMS chain which is partially hydride functionalized. The crosslinking agent (here comprising 27 SiO units) is completely converted using dipoles so that a non-reactive molecule remains which is saturated with dipole and acts as a filler for the matrix. The PDMS used has a functionality f=7.51, which means that 7.51 reactive units per chain are present on average.

1 g crosslinking agent (0.513 mmol, 3.8 mmol react. Si—H) is dissolved with a slight excess of 0.85 dipole (4.2 mmol) in 15 ml chloroform and 0.05 g platinum catalysis is added for the conversion. The mixture is heated under constant stirring at a temperature of T=70° C. with backflow for 12 hours and the insoluble reaction residues are filtered off. The pure filler is obtained by means of reprecipitation in methanol in a yield of 0.26 g (14.9%, 0.0766 mmol).

EXAMPLE 4

Synthesis of the Short-Chain Filler HTMS-3

The short-chain filler is obtained via a hydrosilylation of 1.21 g (0.0054 mol) HTMS (a DMS comprising 3 SiO units, f=1) with 0.87 g of dipole 3 (0.00443 mol). The mixture is converted in accordance with the rule from Example 3. The processing takes place using column chromatography in the solvent toluene. 1.73 g product (92.1%, 0.0042 mol) is obtained.

EXAMPLE 5

Synthesis of the Short-Chain Filler HTMS-4

The conversion takes place in accordance with the rule from Example 3. 2 g (0.00901 mol) of the HTSM used in Example 4 is brought to reaction with 2.66 g (0.00898 mol) dipole 4. After the chromatographic separation of the reactant (solvent THF:petroleum ether=1:6), the substance is obtained in pure form by recrystallization with ethanol. 1.33 g (28.6%, 0.00257 mol) of the product is isolated which is present as a bronze shining metallic solid with a melting point of $T_{melt}$=87-89° C.

EXAMPLE 6

Synthesis of the Reactive Filler Xp-991-3

The experiment routines in accordance with Example 3 again apply to this Example.

1.04 g (0.65 mmol, 16.98 mmol react. Si—H) of a crosslinking agent (28 SiO units, f=26) is brought to reaction with 1.21 g (6.30 mmol) dipole 3 as well as with 0.71 g allyltrimethylsilane (6.22 mmol). Not all the Si—H of the crosslinking agent reacts in this respect. Remaining contaminants (unreacted reactants, Pt-cat.) are extracted from the modified crosslinking agent using methanol. 3.22 g product (97.8%, 0.67 mmol, f=5.30) is obtained.

COMPARISON EXAMPLE

Unmodified Matrix

The unmodified matrix is a two-component system. The base material comprises a vinyl-terminated PDMS which has a mol mass of M=28,000 g/mol$^{-1}$. The matrix is presented together with the catalyst in component A and the partially hydride functionalized crosslinking agent which connects to the network via a hydrosilylation reaction is presented in component B. Chloroform is used as the solvent. The components A and B are mixed in a ratio of 3:1 and crosslink at room temperature after the evaporation.

APPLICATION EXAMPLE 1

Film Manufacture in a One-Step Process

In the one-step process, a third component C is prepared which can be mixed into the matrix of the comparison example. The solution includes the dipole as well as an additional crosslinking agent whose concentration is the same as in the solution B. All the reactive units are compensated by dipoles in solution C. The solutions A:B:C are now mixed together in a volume ratio of 3:1:X (X=0-6) for highly permittive films. The solvent is allowed to evaporate and films the network for 30 minutes at a temperature of T=120° C. An overview of the mechanical and dielectric properties of the materials manufactured in accordance with the application example can be found in Table 1 (entries 1-1 to 1-6).

TABLE 1

| | One-step process | | | % wt | Permittivity | |
|---|---|---|---|---|---|---|
| Sample | Component A | Component B | Component C | Dip | f = 0.1 Hz | f = 1 Hz |
| Comparison example | 3 | 1 | 0 | 0 | 3.48 | 3.37 |
| 1-1 | 3 | 1 | 1 | 1.9 | 4.12 | 3.37 |
| 1-2 | 3 | 1 | 2 | 3.5 | 4.69 | 4.32 |
| 1-3 | 3 | 1 | 3 | 5.1 | 5.77 | 5.11 |
| 1-4 | 3 | 1 | 4 | 6.5 | 6.92 | 5.86 |
| 1-5 | 3 | 1 | 5 | 7.9 | 9.89 | 7.17 |
| 1-6 | 3 | 1 | 6 | 9.1 | 13.37 | 8.75 |

| | Virgin sample | | | | Cycled sample | | |
|---|---|---|---|---|---|---|---|
| Sample | Min. elast. mod. [kPa] | Tear L. [%] | Tear Str. [kP] | Y. Mod. [kPa] | Min. elast. mod. [kPa] | Tear L [%] | Tear Str. [kPa] | Y. Mod. [kPa] |
| Comparison example | 1088 | 236 | 3613 | 1704 | 693 | 207 | 3101 | 1535 |
| 1-1 | 632 | 299 | 2918 | 1262 | 492 | 287 | 3016 | 1108 |
| 1-2 | 358 | 397 | 2541 | 868 | 284 | 393 | 2513 | 723 |
| 1-3 | 232 | 421 | 1701 | 611 | 204 | 403 | 1682 | 558 |
| 1-4 | 158 | 516 | 1459 | 524 | 161 | 469 | 1373 | 468 |
| 1-5- | 106 | 358 | 274 | 307 | 105 | 371 | 289 | 252 |
| 1-6 | 72 | 454 | 446 | 340 | 100 | 408 | 484 | 282 |

As can be seen from the obtained results of Application example 1, the elastomers in accordance with the invention which are dipole modified have a substantially higher permittivity than the polymers without corresponding dipole modification and are thus considerably superior to the materials known from the prior art.

APPLICATION EXAMPLE 2

Film Manufacture with Non-Reactive Fillers:

The polymer matrix (solutions A+B) is selected in accordance with the comparison example. In solution C, the selected filler material, dissolved in chloroform, is presented. The film application is carried out according to Application example 1.

APPLICATION EXAMPLE 3

Film Manufacture with Reactive Fillers:

Component A of the comparison example is selected for the change of the network. The crosslinking agent from component B is replaced by the reactive filler so that the same SiH concentration remains. The film application is carried out according to Application example 1.

The invention claimed is:

1. A method of preparing an actuator or an artificial muscle, said method comprising utilizing a polymer as the actuating or the moving component of the actuator or the artificial muscle, wherein the polymer contains a dipole covalently bonded to the polymer structure in and the structure of the polymer is accordance with the general formula I,

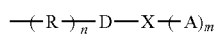

Formula I where

A is an electron acceptor functionality selected from —$NO_2$, —CN, —F, —$CF_3$; cyanovinyl-, dicyanovinyl- or tricyanovinyl- residues;

X is an organic residue with a delocalized electron system which allows a delocalization of the electrons between D and A;

D is an electron donor functionality selected from —O— or —N(B)—, where B is hydrogen or a linear or branched alkyl residue with 1 to 16 carbon atoms;

R represents an alkylene residue with 1 to 16 carbon atoms;

n=0 or 1 and m=1, 2, 3 or 4;

wherein the polymer structure is formed of an elastomer.

2. The method in accordance with claim 1, wherein the dipole is represented by the general Formula II:

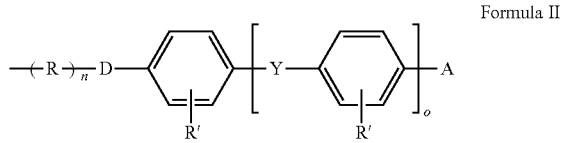

Formula II where

A, D, R and n have the above-indicated meaning and

R' is respectively independently selected from hydrogen, linear or branched alkyl residues with 1 to 18 carbon atoms as well as aromatic residues;

Y is a chemical bond represented or selected from cis- or trans-1,2-ethenediyl, ethinediyl residues, a diazo group or a 1,2-azomethine diyl group; and o=0 to 10.

3. The method in accordance with claim 1, wherein the content of the dipole amounts to between 0.1 and 50% by weight of the polymer.

4. The method in accordance with claim 1, wherein the elastomer is a polysiloxane and the polysiloxane has 3 to 1000 silicon atoms (Si—O).

5. The method in accordance with claim 4, wherein the polysiloxane is selected from the group comprising polydialkylsiloxanes and polyalkylsiloxanes which are partially hydrogen functionalized, with the ratio of the hydrogen functionalizations to the totality of hydrogen functionalizations and alkyl residues amounting to between 0.01 and 1.

6. The method in accordance with claim 1, which has a permittivity measured at 0.1 Hz of at least 4.0 F/m.

7. A method of preparing an actuator or an artificial muscle, said method comprising utilizing a blend including at least one polymer with a dipole covalently bonded to the polymer and at least one further polymer, wherein the at least one polymer containing a dipole covalently bonded to the polymer structure acts as the actuating or moving component of the actuator or the artificial muscle, wherein the structure of the at least one polymer containing a dipole covalently bonded is in accordance with the general formula I,

Formula I where
A is an electron acceptor functionality selected from —$NO_2$, —CN, —F, —$CF_3$, cyanovinyl-, dicyanovinyl-, or tricyanovinyl-residues;
X is an organic residue with a delocalized electron system which allows a delocalization of the electrons between D and A;
D is an electron donor functionality selected from —O— or —N(B)—, where B is hydrogen or a linear or branched alkyl residue with 1 to 16 carbon atoms;
R represents an alkylene residue with 1 to 16 carbon atoms;
n=0 or 1 and
m=1, 2, 3 or 4;
wherein the polymer structure is formed of an elastomer;

wherein the at least one further polymer is selected from elastomers.

8. A molded body including a polymer with a dipole covalently bonded to the polymer structure in accordance with the general formula I,

Formula I where
A is an electron acceptor functionality selected from —$NO_2$, —CN, —F, —$CF_3$, cyanovinyl-, dicyanovinyl-, or tricyanovinyl-residues;
X is an organic residue with a delocalized electron system which allows a delocalization of the electrons between D and A;
D is an electron donor functionality selected from —O— or —N(B)—, where B is hydrogen or a linear or branched alkyl residue with 1 to 16 carbon atoms;
R represents an alkylene residue with 1 to 16 carbon atoms;
n=0 or 1 and
m=1, 2, 3 or 4,
in the form of an actuator or an artificial muscle;
wherein the polymer structure is formed of an elastomer.

9. The method in accordance with claim 1, wherein the elastomer is selected from linear or crosslinked polymers with the dipole being covalently bonded to a silicon atom, polyurethanes, polybutadiene rubbers and/or poly(meth)acrylates.

10. The method in accordance with claim 4, wherein the polysiloxane has 3 to 100 silicon atoms.

* * * * *